United States Patent [19]

Miyagi et al.

[11] Patent Number: 5,445,522
[45] Date of Patent: Aug. 29, 1995

[54] COMBUSTION DEVICE

[75] Inventors: Katsushin Miyagi, Sagamihara; Hiroyuki Mitsuhashi; Kazuo Akimoto, both of Yokohama, all of Japan

[73] Assignees: Tokyo Electron Kabushiki Kaisha; Tokyo Electron Tohoku Kabushiki Kaisha, both of Japan

[21] Appl. No.: 51,945

[22] Filed: Apr. 26, 1993

[51] Int. Cl.$^6$ .............................. F27B 14/00
[52] U.S. Cl. ........................ 432/156; 431/346; 432/241; 432/5; 432/6
[58] Field of Search .......... 432/241, 156, 5, 6; 431/346

[56] References Cited

U.S. PATENT DOCUMENTS

| | | | |
|---|---|---|---|
| 5,245,934 | 9/1993 | Dodson | 110/245 |
| 5,271,732 | 12/1993 | Yokokawa | 432/241 |
| 5,273,424 | 12/1993 | Kobayashi | 432/241 |
| 5,277,579 | 1/1994 | Takanche | 432/241 |
| 5,314,847 | 5/1994 | Watanabe et al. | 437/239 |

FOREIGN PATENT DOCUMENTS 56-62326 5/1981 Japan.
63-210501 9/1988 Japan.
63-60528 11/1988 Japan.

Primary Examiner—Noah P. Kamen
Attorney, Agent, or Firm—Beveridge, DeGrandi, Weilacher & Young

[57] ABSTRACT

This invention relates to a combustion device for feeding hydrogen gas and oxygen gas into a combustion vessel, while heating the same, to generate water vapor. The combustion device comprises a hydrogen gas injection nozzle for feeding hydrogen gas into the combustion vessel, and an oxygen gas injection nozzles for feeding oxygen gas into the combustion vessel. The oxygen nozzles are projected further upward in the combustion vessel beyond the forward end of the hydrogen gas injection nozzle, and opened at a plurality of positions, whereby to diffuse oxygen widely around. The combustion device of this structure can feed a large amount of hydrogen gas for the combustion, whereby a large amount of water vapor can be generated without enlarging the combustion vessel, and troubles, such as the devitrification of the forward ends of the nozzles, abnormal heating in the combustion vessel.

3 Claims, 5 Drawing Sheets

COMBUSTION DEVICE

BACKGROUND OF THE INVENTION

This invention relates to a combustion device to be used in oxidation devices for oxidizing objects to be treated, such as semiconductor wafers.

The fabrication of semiconductor devices includes the oxidation step for forming oxide films on the surfaces of semiconductor wafers. In one technique for this oxidation, semiconductor wafers are contacted with water vapor at a high temperature in an oxidation furnace to form oxide films on their surfaces. The oxidation device for this technique using water vapor is known in, e.g., Japanese Patent Laid-Open Publication (KOKAI) No. 623326/1981, in which hydrogen gas and oxygen gas are fed directly in an oxidation furnace to combust in the oxidation furnace, and water vapor is generated.

But in this oxidation device, in which hydrogen gas and oxygen gas are combusted in the oxidation furnace, the temperature in the oxidation furnace greatly depends on combustion ratios between the hydrogen gas and the oxygen gas. Accordingly it is difficult to sufficiently control the temperature for oxidizing semiconductor wafers. The reliability, safety and reproducibility of the oxidation of semiconductor wafers are low.

In another oxidation device known in, e.g., Japanese Patent Publication (KOKOKU) No. 60528/1988 and Japanese Patent Laid-Open Publication (KOKAI) No. 210501/1988, an external combustion device is provided as a water vapor generating device separately outside an oxidation furnace, and this external combustion device is fed with hydrogen gas and oxygen gas and combusts the same to generate water vapor, which is supplied to the oxidation furnace through a pipe.

This external combustion device allows the heating state in the oxidation furnace to be controlled independently of the operational state of the external combustion device as the water vapor generating device. Accordingly the oxidation of semiconductor wafers in the oxidation furnace can be conducted with high reliability, safety and reproducibility. This external combustion-type oxidation device has been recently noted.

On the other hand, recently semiconductor wafers, which are subjected to the oxidation, have increased diameters, as of 6 inches or 8 inches. To efficiently oxidize semiconductor wafers of such large diameters, it is necessary to feed large amounts of water vapor to oxidation furnaces. Also to this end, it is necessary to generate large amounts of water vapor by using external combustion devices as water vapor generating devices.

For the generation of a large amount water vapor by an external combustion device, large amounts of oxygen and hydrogen have to be fed into and combusted in a combustion vessel of the external combustion device. This results in increases of the gas combustion temperature in the combustion vessel, which cause various troubles. Especially the supply amount of the hydrogen gas has been restricted.

To be specific, conventionally in FIG. 8, large amounts of hydrogen gas and oxygen gas are injected for combustion, heated up to their spontaneous ignition temperatures, from the adjacent end nozzles 50', 51' of a hydrogen gas feed pipe 32 and an oxygen feed pipe 33 which are in a double pipe. Flame is generated from the position of the forward end 32a of the hydrogen gas nozzle at the center of the double pipe. The flame heats the forward end 32a up to a temperature above its devitrification temperature (about 1200° C.) and devitrifies the same (phenomenon that transparent quartz is made opaque to peel off in flakes). This devitrification results in generation of particles which lower yields of products, and deformation of configurations of the nozzles and clogging of the nozzles. In addition, the flame elongates in shape to reach the inside upper wall of the combustion vessel, which is adversely heated to abnormally high temperatures. Thus, although it is preferable to increase the hydrogen combustion amount so as to increase the water vapor generation amount, it too raises the temperature. In addition, the gas feed amount is restricted, and the capacity of the combustion vessel itself has to be increased. These will lead to the problems of higher costs of the combustion device, and larger spaces for the installation of the device.

SUMMARY OF THE INVENTION

In view of these problems, this invention has been made. An object of this invention is to provide a combustion device which can feed a large amount of hydrogen gas to an oxidation furnace for combustion to generate a larger amount of water vapor without increasing the combustion vessel capacity and without causing troubles, such as devitrification of the forward end of the nozzle and abnormal heating of the interior of the combustion vessel.

To achieve the above-described object, the combustion device, according to this invention, for feeding hydrogen gas and oxygen gas while heating the same, through a hydrogen gas feed pipe and an oxygen gas feed pipe and combusting the gasses to generate water vapor comprises, a hydrogen gas injection nozzle provided on the forward end of the hydrogen feed pipe for feeding hydrogen gas into a combustion vessel, and oxygen gas injection nozzles provided on the forward end of the oxygen gas feed pipe for feeding oxygen gas into the combustion vessel, injection ports of the oxygen gas injection nozzles being projected further inward in the combustion vessel beyond the forward end of the hydrogen gas injection nozzle, and being provided by a plurality of openings distributed widely around the forward end of the hydrogen gas injection nozzle.

In the combustion device, of the above-described constitution, according to this invention, the oxygen gas injection nozzles are distributed far away from and around the forward end of the hydrogen gas injection nozzle, and are projected upward beyond the forward end of the hydrogen gas injection nozzle. The oxygen gas can be diffused widely around the hydrogen gas. Consequently, even when larger amounts of hydrogen gas and oxygen gas are supplied to generate a larger amount of water vapor, flame formed when the gasses are ignited is not given forth from the forward end of the hydrogen gas injection nozzle, but from the oxygen gas injection nozzles around the hydrogen gas injection nozzle. As a result, the forward end of the hydrogen gas injection nozzle is not abnormally heated. The flame is shorter and wider than conventional flame, and does not raise the temperature in the combustion vessel to an unacceptable level. Thus, hydrogen can be supplied in larger amounts to generate larger amounts of water vapor without increasing capacities of the combustion vessel, while avoiding problems, such as particles, deformations of a configuration of the nozzle, clogging of the nozzle due to the devitrification of the forward end of the hydrogen gas injection nozzle, and abnormal heating in the combustion vessel.

BRIEF DESCRIPTION OF THE DRAWINGS

FIGS. 1 comprise several views of the combustion device according to one embodiment of this invention.

DETAILED DESCRIPTION OF PREFERRED EMBODIMENTS

One embodiment of this invention will be explained with reference to FIGS. 1 to 7. In this embodiment, the combustion device according to this invention is applied to the water vapor generating device for use in an external combustion-type oxidation device for forming oxide films on semiconductor wafers.

Figure 6:
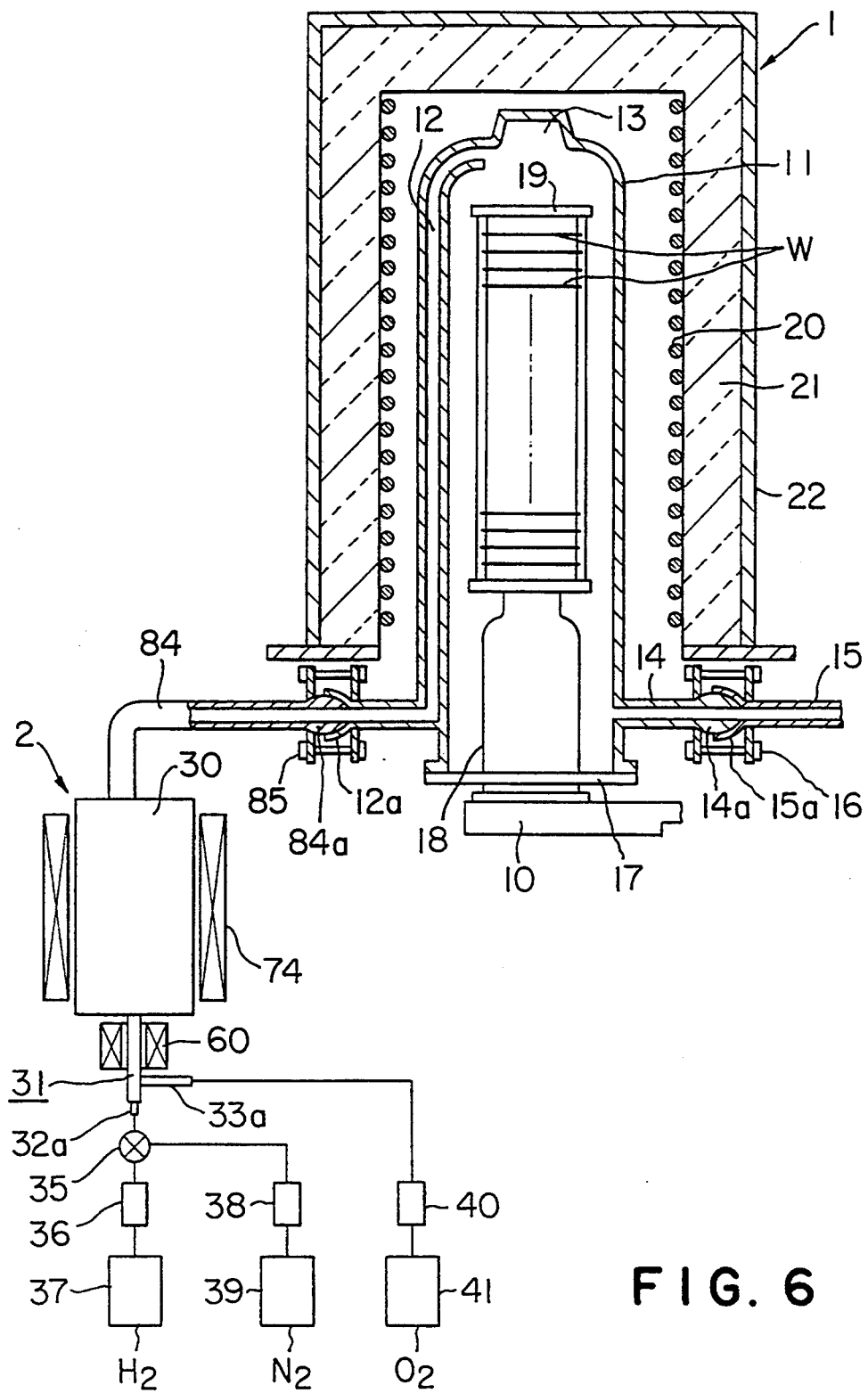
FIG. 6 is a diagrammatic general structural view of the oxidation device the combustion device according to this invention applied to as the water vapor generating device.

FIG. 6 is a diagrammatic view of the oxidation device of the external combustion type according to this invention. The major part of this oxidation device comprises an oxidation furnace 1 and an external combustion device 2 as a vapor generating device, which are interconnected with a pipe.

This oxidation furnace 1 is a vertical furnace of quartz, and includes a vertically cylindrical reaction tube 11 having the lower end opened. A water vapor feed pipe 12 is formed in one-piece with the reaction tube 11 on one side thereof and has the upper end opened in a water vapor inlet port 13 in the upper part of the reaction tube 11. An exhaust pipe 14 is provided on the lower part of the other side of the reaction tube 11 in one-piece therewith. The forward end of the exhaust pipe 14 is fastened to an exhaust connection pipe 15 by a clamp 16 through ball-shaped connections 14a, 15a.

On the open lower end of the reaction tube 11 there is provided a shutter 17 openably. A wafer boat 19 is supported on the shutter 17 through a heat insulating cylinder 18. A plurality of semiconductor wafers W are supported horizontally in the wafer boat 19, vertically spaced from each other in a shelflike manner. The wafer boat 19 is loaded and unloaded vertically from below into the reaction tube 11 together with the heat insulating cylinder 16 therebelow.

A heater 20 is provided around the reaction tube 11 for heating the interior of the reaction tube 11, and a heat insulating material 21 and an outer shell 22 are placed around the outside periphery of the heater 20.

Figure 3:
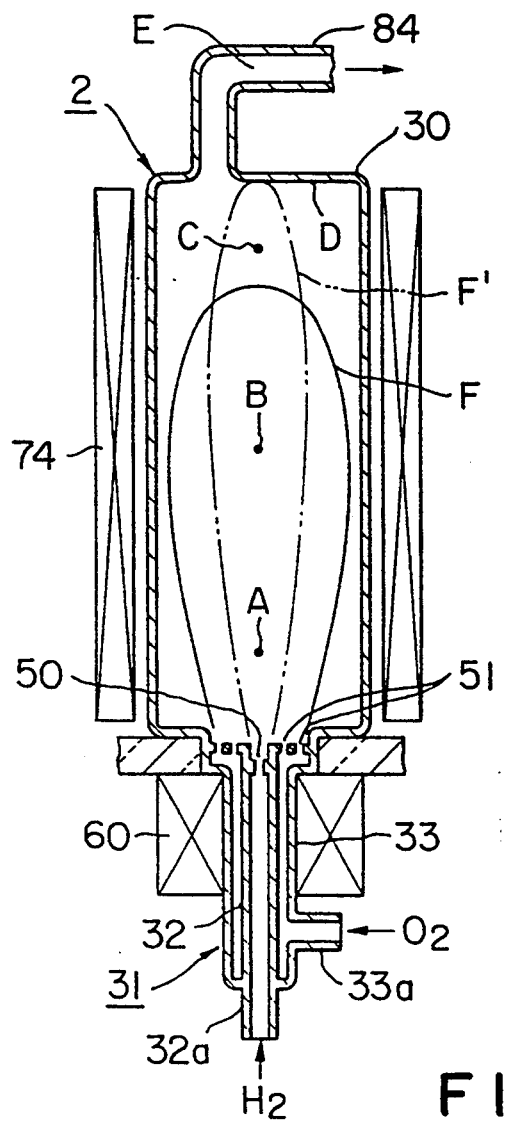
FIG. 3 is a vertical sectional view of the combustion device according to the embodiment illustrating its general structure.

As shown in FIGS. 3 and 6, the external combustion device 2 comprises a vertically installed combustion vessel 30. The combustion vessel 30 is a vertical cylinder of quartz. A gases feed pipe 31 of quartz extended in one-piece with the combustion vessel downward from the bottom thereof. As shown in FIGS. 1 and 3, the gases feed pipe 31 is a double pipe. The inner pipe of the double pipe is a hydrogen feed pipe 32, and the outer pipe concentric with the inner pipe is an oxygen gas feed pipe 33. The inner hydrogen feed pipe 32 has a connection port 32a extended lower than the lower end of the outer oxygen gas feed pipe 33. The outer oxygen feed pipe 33 has a connection port 33a which is extended to one side from a part upper from the lower end thereof.

As shown in FIG. 6, the connection port 32a of the hydrogen feed pipe 32 is connected to a hydrogen gas source 37 with a pipe through a change-over valve 35 and a flow rate control mechanism 36. The connection port 32a is connected to a nitrogen gas source 39 through a flow rate control mechanism 38 with a pipe branched from the change-over valve 35. The connection port 33a of the oxygen gas feed pipe is connected to an oxygen gas source with a pipe through a flow rate control mechanism 40.

Figure 1A:
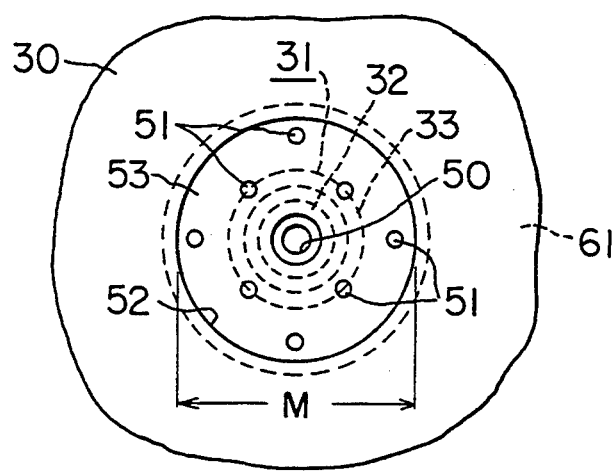
FIG. 1A is a plan view of gas injection nozzles at the bottom of the combustion vessel.
Figure 1B:
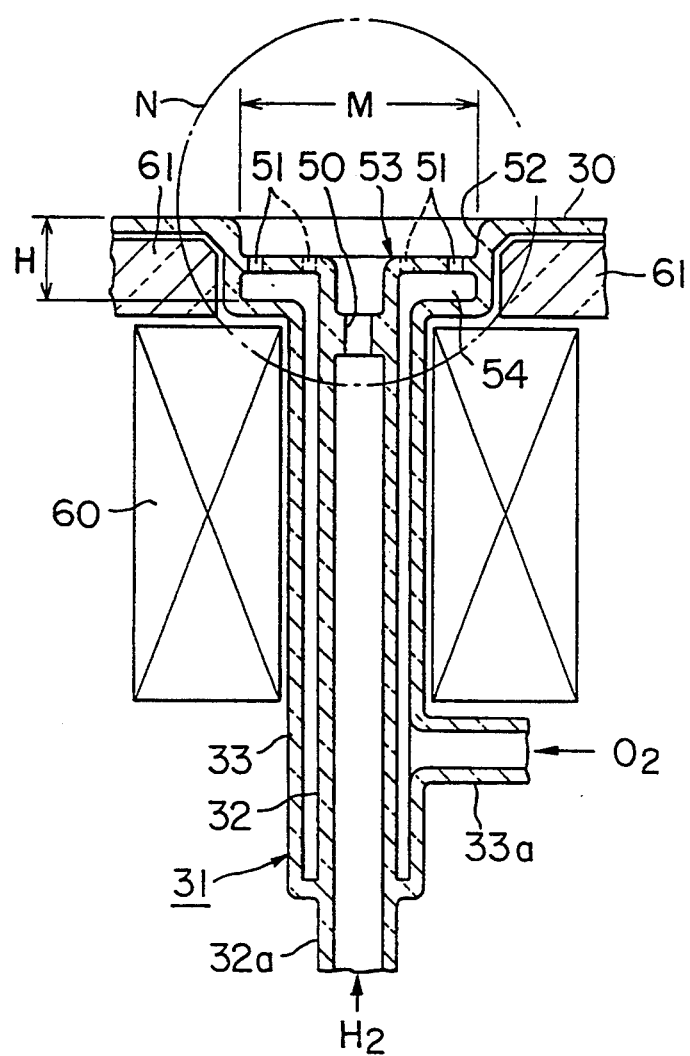
FIG. 1B is a vertical sectional view of one example of the gas injection nozzle unit.
Figure 2:
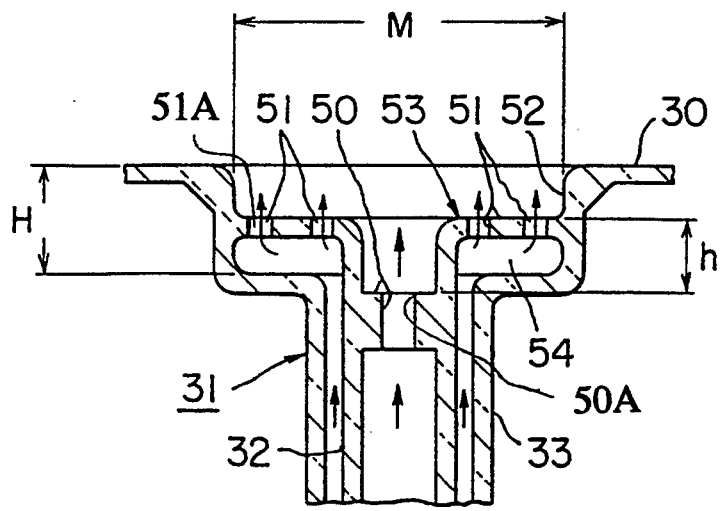
FIG. 2 is an enlarged vertical sectional view of the part N in the gas injection nozzles unit.

As shown in FIG. 1A and FIG. 1B, a hydrogen gas injection nozzle 50 of quartz, and oxygen gas injection nozzles 51 are formed in the upper end of the double gas feed pipe 31 in one-piece therewith, i.e., in the proximal end of the gases feed pipe 31 attached to the bottom of the combustion vessel 30. The oxygen gas injection ports 51A are projected a little higher inwardly in the combustion vessel 30 (indicated by h) than the hydrogen gas feed port 50A, and are opened inside the combustion vessel at a plurality of positions so that the oxygen gas is diffused widely around.

To be more specific, in the center of the bottom of the combustion vessel there is formed in one-piece therewith an larger-diameter concavity having a depth of about 10 mm and a diameter (M) of about 40 mm. The upper end of the oxygen feed pipe 33 is connected to the bottom of the concavity 52 conically therewith. An annular diffusion plate 53 of a suitable width like a partition wall is formed horizontally in one-piece with the larger-diameter concavity 52 at the middle of the depth. The upper end of the hydrogen gas feed pipe 32 is connected to the inner periphery of the diffusion plate 53.

The hydrogen gas injection nozzle 50, which also serves to prevent the back flow of the oxygen gas, is formed in one-piece with the inner hydrogen gas feed pipe 32 by reducing a diameter thereof at a position a little lower than the diffusion plate 53 for the hydrogen gas feed pipe 32.

The oxygen gas injection pipe 33 is in communication with a annular concavity space below the diffusion plate 53 inside the concavity 52. The oxygen gas injection nozzles (holes) 51 of a small diameter are bored in the diffusion plate 53, spaced from each other so that the oxygen gas is injected, inwardly diffused in the combustion vessel 30. Four of eight oxygen gas injection nozzles (holes) 51 are spaced from each other around the outer larger periphery of the diffusion plate 53, and the other four are spaced from each other around the inner smaller periphery of the diffusion plate 53. The four outer oxygen gas injection nozzles (holes) 51 are circumferentially offset by 45° from the four inner oxygen gas injection nozzles (holes) 51.

A gas heater 60 is provided around the double gases feed pipe 31. The gas heater 60 heats the hydrogen gas flowing in the hydrogen gas feed pipe 32 and the oxygen gas flowing in the oxygen gas feed pipe 33 up to a temperature above their spontaneous ignition temperatures. The hydrogen gas and the oxygen gas, which have been heated, are injected respectively from the hydrogen gas injection nozzle 50 and the oxygen gas injection nozzles 51 into the combustion vessel 30 to be mixed with each other, and the hydrogen gas and the oxygen gas are combusted, giving forth flame F. (see FIG. 3.) A heat insulating material 61 is provided between the gas heater 60 and the underside of the combustion vessel 30. As shown in FIG. 3, the combustion vessel 30 is surround by a cooling mechanism 74 provided by a water jacket. A water vapor outlet pipe 84 of quartz projected from the upper end of the combustion vessel 30 in one-piece therewith. The water vapor outlet pipe 84 is connected to the lower end of the wave vapor feed pipe 12 at ball-shaped connections 84a, 12a by a clamp 85.

The operation of the oxidation device, of this structure, according to this invention will be explained below. First, an initial purge is conducted by nitrogen gas. In FIG. 6, the change-over valve 35 is switched to introduce nitrogen gas into the reaction tube 11 of the oxidation furnace 1 through the hydrogen gas feed pipe 32, the combustion vessel 30, the water vapor outlet pipe 84 and the water vapor feed pipe 12, controlling by the flow rate control mechanism 38 a flow rate of the nitrogen gas from the nitrogen gas source 39. The nitrogen gas purges the gas in the combustion vessel, the reaction tube 11 of the oxidation furnace 1, the piping associated with the oxidation furnace 1. The replacement of the gas with the nitrogen gas is conducted while exhausting the gas in the reaction tube 11 through the exhaust pipe 14 and the connection pipe 15.

Then, when the gas in all the piping has been replaced with the nitrogen gas, the shutter 17 at the lower end of the reaction tube 11 is opened, and the wafer boat 19 with a number of semiconductor wafers W mounted thereon is raised into the reaction tube 11 together with the heat insulating cylinder 18 by a boat elevator 10. And the semiconductor wafers W to be oxidized are loaded and positioned at a set position in the reaction tube 11.

In this state the feed of the nitrogen gas is stopped, and oxygen gas is fed into the oxygen gas feed pipe 33, controlled by the flow rate control mechanism 40. The oxygen gas follows the above-mentioned passage into the reaction tube 11. Thus, the nitrogen gas in the combustion vessel 30, the reaction tube 11 of the oxidation furnace 1, and the piping associated therewith, is replaced by the oxygen gas.

In this oxygen gas-fed state, the gas heater 74 is kept at, e.g., about 850° C., the change-over valve 35 is switched to feed hydrogen gas from the hydrogen gas source 37 into the hydrogen gas feed pipe 32, controlled by the hydrogen gas flow control mechanism 36. The hydrogen gas and the oxygen gas are fed at set flow rates, such as 3 liters per minute. The hydrogen gas and the oxygen gas are heated by the gas heater 60 while flowing through the gas feed pipe 31.

In FIGS. 1 and 3, the heated hydrogen gas and the heated oxygen gas are injected into the combustion vessel through the hydrogen gas injection nozzle 50 and the oxygen gas injection nozzles 51 to be mixed, and spontaneously ignite to combust in flame F. Thus a water vapor is generated.

Because the oxygen injection nozzles 51 are distributed remote from the forward end of the hydrogen gas injection nozzle 50 and are projected further beyond the forward end of the hydrogen gas injection nozzle 50, the oxygen gas can be diffused from the oxygen gas injection nozzles 51 around the hydrogen gas widely.

Thus flame F is not given forth from the forward end of the hydrogen gas injection nozzle 50, but from the forward ends of the oxygen gas injection nozzles 51, even when larger amounts of hydrogen and oxygen gas are fed for the generation of a larger amount of water vapor. Accordingly, the forward end of the hydrogen gas injection nozzle 50 avoids being abnormally heated. The flame F does not rise as high as conventional flame does, and spreads wider radially, and is shorter. Consequently, the flame F is prevented from contacting the inside surface of the top of the combustion vessel 30, and the temperature inside the combustion vessel 30 does not abnormally rise.

Figure 4:
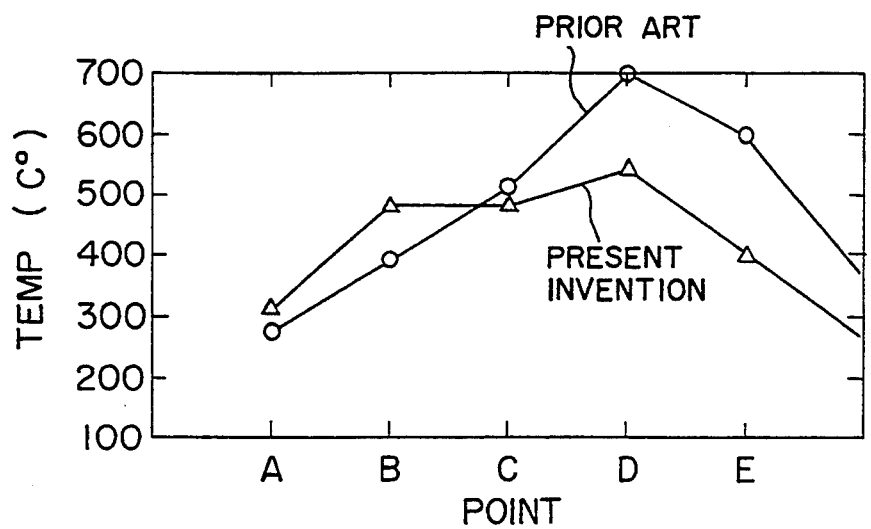
FIG. 4 is a graph of the temperature distribution of the combustion device according to this invention at vertically different points in the combustion vessel in comparison with that of the conventional combustion device.

FIG. 4 shows the temperature distribution of the combustion vessel 30 of the device according to this embodiment at positions A to D from upper to lower (see FIG. 3) in comparison with the temperature distribution of the conventional device. As seen in the graph of FIG. 4, in the device according to this invention the temperature distributes below about 500° C. Especially even at the position D at the upper end of the inner cylinder 71 of the combustion vessel 30, the temperature rises only up to about 530° C., and the temperature does not exceed 700° C., as it does in a conventional device.

Thus, a larger amount of hydrogen gas can be fed for combustion without increasing an internal capacity of the combustion vessel 30, especially a height of the combustion vessel 30, and without enlarging the whole combustion device 2, and with fewer particle formation problems, deformations of a configuration of the nozzle and clogging of the nozzle due to the devitrification of the forward end of the hydrogen gas injection nozzle 50, and abnormal heating in the combustion vessel 30. Thus larger amounts of hydrogen gas can be introduced.

The hydrogen gas and the oxygen gas fed into the combustion vessel 30 combust in a ratio of substantially 2:1 in accordance with stoichiometry. Accordingly the oxygen gas is a little excessively supplied, but an excessive amount of the oxygen gas functions as the carrier gas for the water vapor and contributes to the oxidation in the oxidation furnace 1. But it should be noted that an excessive supply of hydrogen gas will result in explosions, and hydrogen should not be fed excessively.

Feed amounts of hydrogen and oxygen are decided suitably in accordance with a degree of intended oxidation, and their feed amounts are controlled by the flow rate control mechanisms 36, 40.

A large amount of water vapor thus generated by the combustion of the hydrogen gas and the oxygen gas in the combustion vessel 30 rises in the combustion vessel 30, is suitably cooled by the cooling mechanism 74 around the combustion chamber 30, and is supplied into the reaction tube 11 of the oxidation furnace 1 through the water vapor outlet pipe 84 at the upper end of the combustion vessel 30 and the water vapor feed pipe 12.

A large amount water vapor fed into the reaction vessel 11 of the oxidation furnace 1 flows down from the water vapor feed port 13 on the upper end of the reaction tube 11. On the other hand, the semiconductor wafers W mounted on the wafer boat 9 in the reaction tube 11 are maintained at a height temperature above about 900° C. by the heater 20. Accordingly the semiconductor wafers W are oxidized as required. The water vapor which has flowed down to the lower part of the reaction tube 11 passes through the exhaust pipe 14 and the exhaust connection pipe 15 to be discharged through a factory exhaust duct.

When the oxidation of the semiconductor wafers W in the oxidation furnace 1 is finished, the hydrogen supply from the hydrogen gas source 37 is stopped, and only oxygen gas is continuously fed. The gas in the external combustion device 2 and the piping, and the oxidation furnace 1 is replaced by oxygen gas. Then the oxygen gas supply is stopped, and then, as described above, the change-over valve 35 is switched to feed nitrogen gas from the nitrogen gas source 39, so that the oxygen in the external combustion device 2 and the piping, and the oxidation furnace is replaced by nitrogen. In this state, the oxidized semiconductor wafers W on the wafer boat 9 are lowered together with the heat insulating cylinder 18 out of the oxidation furnace 1, and a next oxidation operation can be started.

Figure 5:
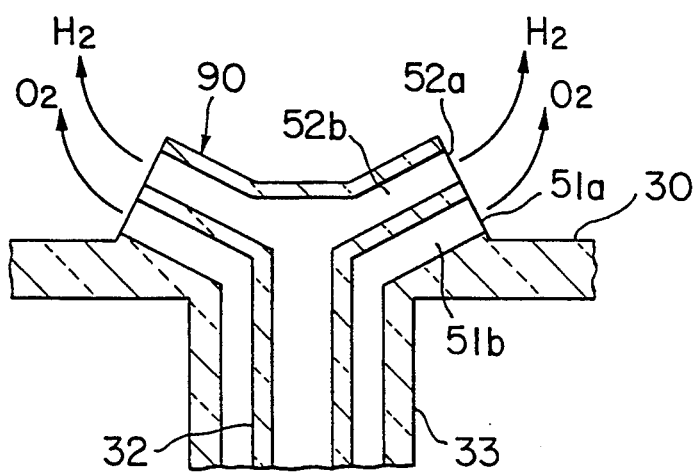
FIG. 5 is a vertical sectional view of another example of a gas injection nozzle unit.

FIG. 5 is a vertical sectional view of another example the gas injection nozzle unit for use in the combustion device according to this invention.

In the gas injection nozzle portion of this embodiment, a gas feed head 90 is projected from the bottom of the combustion vessel 30 in one-piece therewith. This gas feed head 90 is in the form of a double pipe of a hydrogen gas feed pipe 32 and an oxygen gas feed pipe 33. A hydrogen injection nozzle 32a of the hydrogen feed pipe 32 and an oxygen gas injection nozzle 33a of the oxygen gas injection pipe 33 are formed on the respective forward ends of a hydrogen gas passage 52b and an oxygen gas passage 51b both of which are slanted upward and expanded as they are extended radially outward so that the hydrogen gas injection nozzle 32a and the oxygen gas injection nozzle 33a are positioned vertically one on the other at the outer periphery of the gasses feed head 90. The hydrogen gas passage 52b and the oxygen gas passage 52b may be helically extended outward, gradually expanded.

In the gas feed head 90 of this structure, owing to the direction of the hydrogen gas passage 52b and the oxygen gas passage 51b, hydrogen gas is fed into a combustion space 70, radially outwardly spread. Consequently, even when large amounts of hydrogen gas and oxygen gas are fed to generate a large amount of water vapor, the flame F radially spread but does not rise too high. Accordingly the flame F is prohibited from directly contacting with the inside surface of the top of the combustion vessel 30 without increasing a height of the inner cylinder 71 of the combustion vessel 30, i.e. increasing a size of the combustion device 2.

Figure 7:
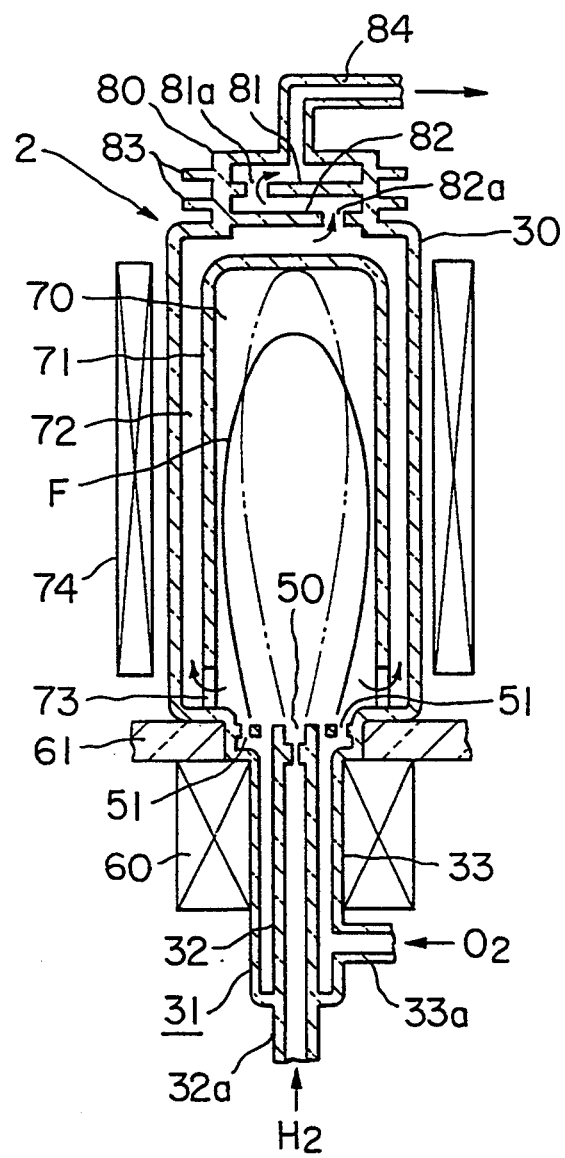
FIG. 7 is a vertical sectional view of the combustion device according to another embodiment of this invention.
Figure 8:
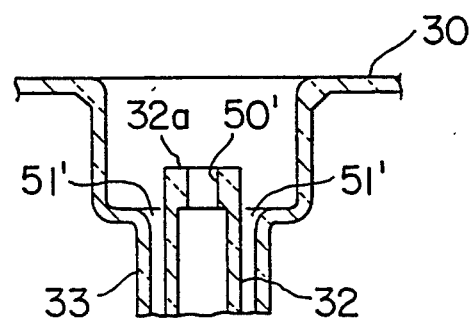
FIG. 8 is a vertical sectional view of a gas injection nozzle unit of the conventional combustion device.

FIG. 7 is a vertical sectional view of the combustion device according to another embodiment of this invention. In this embodiment as well as the above-described embodiment, a combustion vessel 30 having a hydrogen gas injection nozzle 50 and an oxygen gas injection nozzle 51 on the bottom thereof conically accommodates an inner cylinder 71 of quartz for defining a combustion space 70. The inner cylinder 71 has the shape of a cylindrical cap having the upper end closed, and has the open lower end secured to the inside of the bottom. A cylindrical space 72 is defined between the outside periphery of the inner cylinder 71 and the inside periphery of the combustion vessel 30. A plurality of communication ports for communicating the cylindrical space 72 with the combustion space 70 are formed at a certain interval in the lower part of the peripheral wall of the inner cylinder 71. Around the combustion vessel 30 of this structure there is provided a cooling mechanism 74 as in the above-described embodiment.

A water vapor outlet unit 80 of quartz is formed on the upper end of the combustion vessel 30 in one-piece therewith. The water vapor outlet unit 80 has the shape of a cylindrical cap having a smaller diameter than the combustion vessel 30. The water vapor outlet unit 80 accommodates two internal radiator panels 81, 82 of quartz formed horizontally in one-piece therewith and vertically spaced from each other for winding upward water vapor for cooling. Through-holes 81a, 82a are formed, offset from each other, through the respective radiator panels 81, 82. On the outer periphery of the water vapor outlet unit 80, two external radiator panels of quartz are formed in one-piece therewith, projected in vertically spaced collars. A water vapor outlet pipe 84 is projected from the upper end of the water vapor outlet unit 80 and, as shown in FIG. 6, connected to the lower end of a water vapor feed pipe 12 of the oxidation furnace 1.

In the external combustion device 2 of FIG. 7, heated hydrogen gas and heated oxygen gas injected into the combustion space 70 in the inner cylinder 71 of the combustion vessel 30 from the inner hydrogen gas injection nozzle 50 and the outer oxygen gas injection nozzle 51 and mixed, and spontaneously ignite and combust in flame F. And water vapor is generated.

As described in connection with the above-described embodiment, even when larger amounts of hydrogen gas and oxygen gas are fed to generate more water vapor, the flame F of the ignited mixed gas is not formed at the forward end of the hydrogen gas injection nozzle 50, but at the peripheral oxygen gas injection nozzle 51. Consequently the forward end of the hydrogen gas injection nozzle 50 is prevented from being abnormally heated. The flame F does not rise upward, but radially expands short and wide. The flame F is prohibited from directly contacting the inside surface of the upper end of the inner cylinder 7 of the combustion vessel 30, and the temperature inside the combustion vessel 30 does not abnormally rise.

A large amount of water vapor thus generated by the combustion of the hydrogen gas and the oxygen gas in the combustion space 70 in the inner cylinder 71 of the combustion vessel 30 flows into a cylindrical space 72 through the communication port 73 in the lower part of the inner cylinder 71 and flows upward therein. During this upward flow, the high-temperature water vapor is efficiently and suitably cooled by the cooling mechanism around the combustion vessel 30.

The generated water vapor further winds upward from the interior of the cylindrical space 72 through the through-holes 81a, 82a in the vertically spaced internal radiator panels 81, 82 in the water vapor outlet unit 80. During this winding up, the water vapor is more efficiently heat-exchanged by the external radiator panels 83 in addition to the internal radiator panels. As described above, the thus-cooled water vapor is supplied from the water vapor outlet pipe 84 on the upper end of the combustion vessel 30 into the reaction tube 11 of the oxidation furnace 1 through the water vapor feed pipe 12.

The combustion device according to this invention is not limited to the above-described embodiments. In the above-described embodiments, the external combustion device according to this invention is applied to an external combustion device for feeding water vapor to, e.g., a vertical oxidation furnace 1. The oxidation furnace may be horizontal. The combustion device according to this invention may be applied to devices for forming oxide films on the various objects other than semiconductor wafers, and other treatment devices.

What is claimed is:

1. An oxidation furnace for treating semiconductor wafers, said furnace having a combustion device for feeding hydrogen gas and oxygen gas, while heating the same, through a hydrogen gas feed pipe and an oxygen gas feed pipe and combusting the gases to generate water vapor, said combustion device comprising:

an elongate combustion vessel having a first end portion and a second end portion located opposite to said first end portion;

a hydrogen gas injection nozzle located centrally in said first end portion and provided on a forward end of said hydrogen gas feed pipe for axially feeding hydrogen gas into said first end of said elongate combustion vessel, said hydrogen injection nozzle having an injection port;

a plurality of oxygen gas injection nozzles each having an injection port, said oxygen gas injection nozzles being located concentrically around said hydrogen injection nozzle, said oxygen gas injection nozzles being provided on a forward end of said oxygen gas feed pipe for axially feeding oxygen gas into said first end portion of said elongate combustion vessel, said oxygen gas injection ports being located further forward toward said second end portion in said elongate combustion vessel beyond said injection port of said hydrogen gas injection nozzle, said combustion vessel having a water vapor outlet located at said second end of said elongate combustion vessel.

2. The combustion device according to claim 1, wherein said first end portion of said elongate combustion vessel has a cavity integrally formed therewith, said hydrogen gas feed pipe being connected to said first end portion of said cavity at a central portion, said cavity having an upper wall defined by an annular diffusion plate disposed horizontally with respect to said cavity, said plate having a middle part that extends to substantially the depth of said cavity, said forward end portion of said hydrogen gas injection pipe being connected to the inner periphery of said middle part of said diffusion plate, and an annular diffusion space is defined below said diffusion plate said oxygen gas feed pipe being connected to said annular space.

3. An oxidation furnace for treating semiconductor wafers, said furnace having a combustion device for feeding hydrogen gas and oxygen gas, while heating the same, through a hydrogen gas feed pipe and an oxygen gas feed pipe, and combusting the gases to generate water vapor, said combustion device comprising:

an elongate combustion vessel having a first end portion, and a second end portion located opposite of said first end portion, a gas feed head centrally connected to said first end portion of said elongate combustion vessel and integrally formed therewith, wherein said gas feed head has a hydrogen passage and an oxygen passage formed about said hydrogen passage, said hydrogen passage and said oxygen passage having respective injection ports for feeding gas into said elongate combustion vessel, said hydrogen passage and said oxygen passage being in communication with said hydrogen gas feed pipe and said oxygen gas feed pipe respectively, said hydrogen feed passage and said oxygen feed passage each extending radially outwardly at where they respectively terminate in their said injection ports.

* * * * *